(12) United States Patent
Han

(10) Patent No.: US 9,356,041 B2
(45) Date of Patent: May 31, 2016

(54) 3-D NONVOLATILE MEMORY DEVICE AND METHOD OF MANUFACTURING THE SAME

(71) Applicant: SK hynix Inc., Gyeonggi-do (KR)

(72) Inventor: Joo Hee Han, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/568,968

(22) Filed: Dec. 12, 2014

(65) Prior Publication Data

US 2015/0097229 A1 Apr. 9, 2015

Related U.S. Application Data

(62) Division of application No. 13/598,579, filed on Aug. 29, 2012, now Pat. No. 8,936,984.

(30) Foreign Application Priority Data

Dec. 22, 2011 (KR) .................. 10-2011-0139988

(51) Int. Cl.
*H01L 27/115* (2006.01)
*H01L 27/06* (2006.01)
*H01L 29/66* (2006.01)
*H01L 29/792* (2006.01)

(52) U.S. Cl.
CPC ...... *H01L 27/11582* (2013.01); *H01L 27/0688* (2013.01); *H01L 29/66833* (2013.01); *H01L 29/7926* (2013.01)

(58) Field of Classification Search
CPC ............ H01L 27/0688; H01L 29/7926; H01L 29/66833; H01L 27/11582; H01L 27/115; H01L 27/11521; H01L 21/28273; H01L 29/66825; H01L 27/11568; H01L 29/7813; H01L 29/7802; H01L 29/7827; H01L 29/66666; H01L 27/11556; H01L 23/5226; H01L 27/11578; H01L 23/481; G11C 5/02; G11C 5/06

See application file for complete search history.

(56) References Cited

U.S. PATENT DOCUMENTS

| | | | | |
|---|---|---|---|---|
| 2010/0178759 | A1* | 7/2010 | Kim et al. | 438/591 |
| 2010/0276743 | A1* | 11/2010 | Kuniya | H01L 27/115 257/315 |
| 2011/0291177 | A1* | 12/2011 | Lee et al. | 257/324 |
| 2012/0153380 | A1* | 6/2012 | Lee | H01L 27/10888 257/330 |

* cited by examiner

*Primary Examiner* — Michelle Mandala
(74) *Attorney, Agent, or Firm* — IP & T Group LLP

(57) ABSTRACT

A three-dimensional (3-D) nonvolatile memory device includes channel layers protruding perpendicular to a surface of a substrate, interlayer insulating layers and conductive layer patterns alternately formed to surround each of the channel layers, a slit formed between the channel layers, the slit penetrating the interlayer insulating layers and the conductive layer patterns, and an etch-stop layer formed on the surface of the substrate at the bottom of the slit.

7 Claims, 6 Drawing Sheets

3-D NONVOLATILE MEMORY DEVICE AND METHOD OF MANUFACTURING THE SAME

CROSS-REFERENCE TO RELATED APPLICATION

This application is a division of U.S. patent application Ser. No. 13/598,579 filed on Aug. 29, 2012, which claims priority to Korean patent application number 10-2011-0139988 filed on Dec. 22, 2011. The entire disclosure of which is incorporated by reference herein, is claimed.

BACKGROUND

Embodiments of this disclosure relate to a semiconductor device and a method of manufacturing the same and, more particularly, to a three-dimensional (3-D) nonvolatile memory device and a method of manufacturing the same.

Technology for memory devices is developing toward a high degree of integration. In order to improve the degree of integration of memory devices, schemes for reducing the size of memory cells arranged in a 2-D way have been developed. As the size of the memory cells of the 2-D memory device is reduced, a multi-level cell (MLC) operation is not normally performed due to increased interference and disturbance. In order to overcome the limit of the 2-D memory device, a 3-D structured memory device for improving the degree of integration by arranging memory cells over a substrate in a 3-D way has been proposed. The 3-D structured memory device can improve the degree of integration, as compared with the case where memory cells are arranged in a 2-D way because the area of the substrate can be efficiently used.

The memory cells of the 3-D memory device include a plurality of conductive layers and a plurality of interlayer insulating layers alternately stacked and vertical channel layers configured to penetrate the conductive layers and the interlayer insulating layers. A variety of techniques are recently being proposed in order to improve reliability of the 3-D memory device.

BRIEF SUMMARY

An exemplary embodiment of this disclosure a 3-D nonvolatile memory device and a method of manufacturing the same.

In an aspect of this disclosure, a 3-D nonvolatile memory device includes: channel layers protruding perpendicular to a surface of a substrate; interlayer insulating layers and conductive layer patterns alternately formed to surround each of the channel layers; a slit formed between the channel layers, the slit penetrating the interlayer insulating layers and the conductive layer patterns; and an etch-stop layer formed on the surface of the substrate at a bottom of the slit.

In another aspect of this disclosure, a method of manufacturing a 3-D nonvolatile memory device includes: forming a stack structure by alternately forming first material layers and second material layers over a substrate; forming channel layers extending perpendicular to a surface of the substrate, the channel layers penetrating the first and the second material layers; forming a slit, exposing a portion of the surface of the substrate, by etching the first material layers and the second material layers between the channel layers; and forming an etch-stop layer on the portion of the surface of the substrate exposed through the slit.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
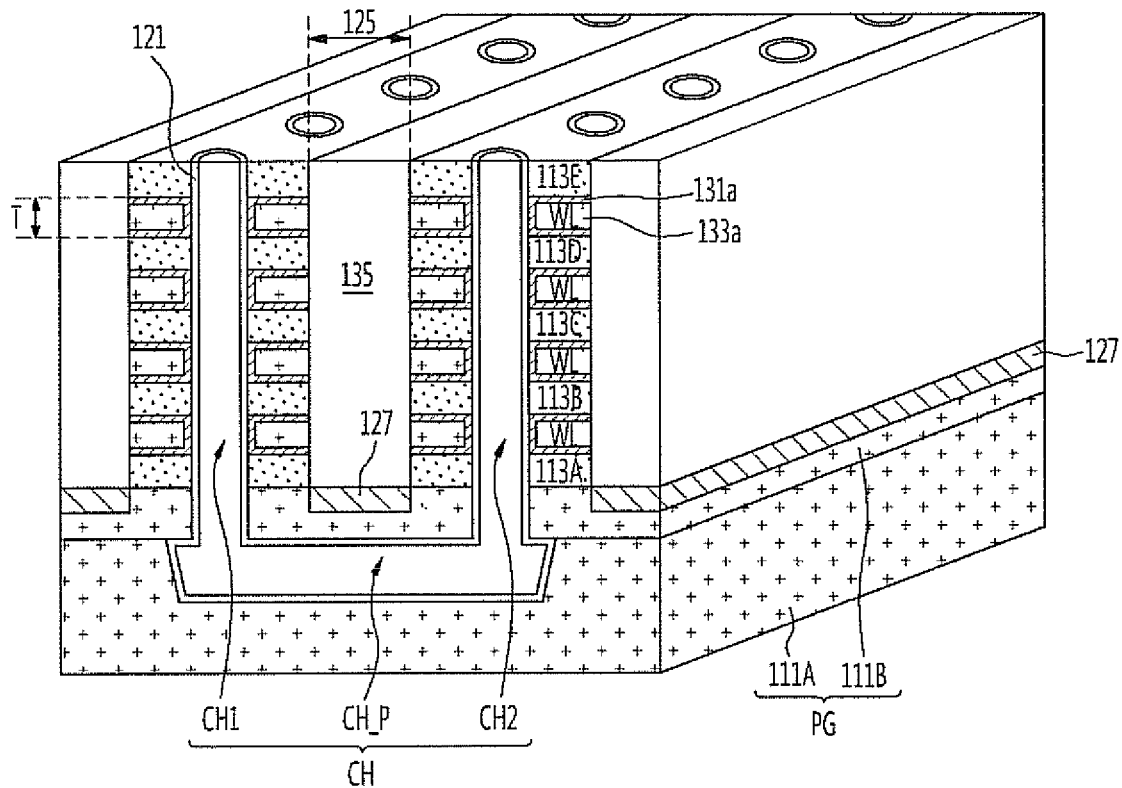
FIG. 1 is a perspective view showing a 3-D nonvolatile memory device according to an exemplary embodiment of this disclosure.

FIG. 1 is a perspective view showing a 3-D nonvolatile memory device according to an exemplary embodiment of this disclosure.

The 3-D nonvolatile memory device, according to an exemplary embodiment, includes a plurality of vertical channel layers (for example, CH1 and CH2), upwardly protruding from a substrate. A pipe gate PG, a plurality of interlayer insulating layers 113A-113E, and a plurality of conductive layer patterns 133a, are alternately stacked around the vertical channel layers CH1 and CH2. The conductive layer patterns 133a may be used as word lines WL.

The pipe gate PG may be a semiconductor substrate or may be formed of a conductive layer formed on the semiconductor substrate. The pipe gate PG includes a first conductive layer 111A and a second conductive layer 111B formed on the first conductive layer 111A. The second conductive layer 111B is a capping layer. The plurality of vertical channel layers CH1 and CH2 penetrates the second conductive layer 111B. An etch-stop layer 127 is formed on a surface of the second conductive layer 111B between the vertical channel layers CH1 and CH2. The etch-stop layer 127 is made of a material having a great etch selectivity for the first and the second conductive layers 111A and 111B or the conductive layer patterns 133a. Therefore, the etch-stop layer 127 may be etched at a much slower rate (if at all) than the materials that form the first and the second conductive layers 111A and 111B or the conductive layer patterns 133a. For example, the etch-stop layer 127 may be an oxide layer formed by oxidizing a surface of the second conductive layer 111B.

The conductive layer patterns 133a and the interlayer insulating layers 113A-113E are separated by a slit 125 that is formed between the vertical channel layers CH1 and CH2. The slit 125 penetrates the conductive layer patterns 133a and the interlayer insulating layers 113A-113E. The slit 125 is filled with an insulating layer 135.

The etch-stop layer 127 is formed on a surface of the second conductive layer 111B at a bottom of the slit 125. As will be described later, the conductive layer patterns 133a are formed from a conductive layer that is also formed in the slit 125 and trenches T. Accordingly, the conductive layer, formed within the slit 125, will be removed so that the conductive layer patterns 133a remain only within the trenches T. The etch-stop layer 127 functions to protect the substrate, including the pipe gate PG, during the process of removing the conductive layer formed within the slit 125. In particular, the etch-stop layer 127 can protect the second conductive layer 111B when performing the process of removing the conductive layer formed within the slit 125.

If the conductive layer patterns 133a are made of metal materials of low resistance (for example, tungsten), in order to lower resistance, the conductive layer patterns 133a may be surrounded by a barrier metal layer patterns 131*a*. The barrier metal layer patterns 131*a* may be made of, for example, titanium nitride (TiN).

A plurality of pipe trenches T-PG is formed in the first conductive layer 111A, and each of the plurality of pipe trenches T-PG is filled with a pipe channel layer CH_P. The pipe channel layer CH_P couples a pair of the vertical channel layers CH1 and CH2. As a result, U-shaped channel layers CH, each including the first and the second vertical channel layers CH1 and CH2 and the pipe channel layer CH_P, are formed.

An outer surface of the U-shaped channel layer CH is surrounded by a memory stack layer 121. The channel layer CH may be formed by filling the memory stack layer 121, with a semiconductor layer as shown in FIG. 1. Alternatively, the channel layer may also include an insulating layer formed in a center portion of the semiconductor layer. The memory stack layer 121, which surrounds the outer wall of the channel layer CH, may include a tunnel insulating layer, a charge trap layer, configured to surround the tunnel insulating layer, and a charge blocking layer configured to surround the charge trap layer.

The sidewalls and bottom of the pipe channel layer CH_P are surrounded by the first conductive layer 111A, and the top of the pipe channel layer CH_P is covered with the second conductive layer 111B. An electric field applied to the pipe channel layer CH_P can be enhanced through the second conductive layer 111B.

Memory cell transistors are formed at the intersections of the word lines WL and the vertical channel layers CH1 and CH2, and a pipe transistor is formed at the intersection of the pipe gate PG and the pipe channel layer CH_P. For example, in an exemplary embodiment the memory cell transistors may be stacked along the vertical channel layers CH1 and CH2 in a 3-D array. Two columns of the memory cell transistors are coupled by the pipe transistor, thus forming a U-shaped memory string.

FIGS. 2A to 2H are cross-sectional views showing a method of manufacturing the 3-D nonvolatile memory device according to an exemplary embodiment.

Figure 2A:
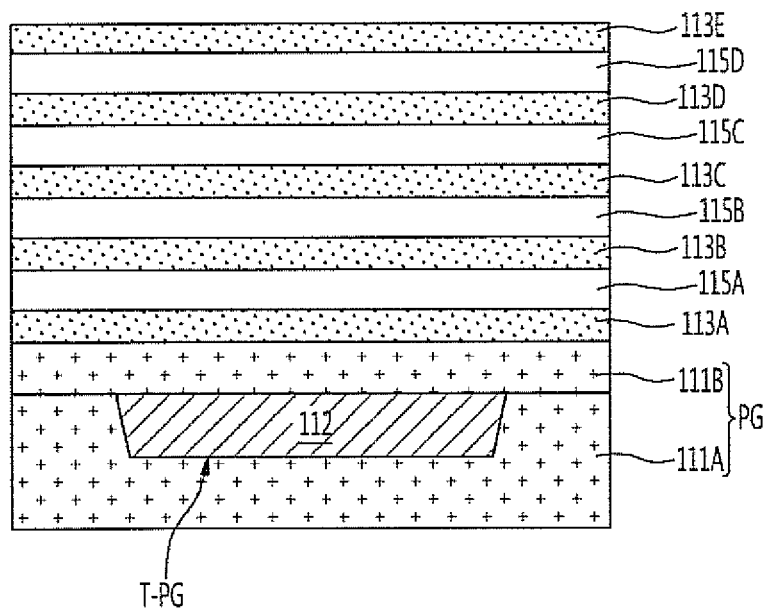
FIGS. 2A to 2H are cross-sectional views showing a method of manufacturing the 3-D nonvolatile memory device according to an exemplary embodiment of this disclosure.

Referring to FIG. 2A, the substrate includes the pipe gate layers PG, which are each filled with a sacrificial layer 112. The pipe gate layers PG, which are each filled with the sacrificial layer 112, each include the first conductive layer 111A and the second conductive layer 111B, which is a capping layer. The pipe gate layers PG may be formed by forming pipe trenches T-PG within the first conductive layer 111A, filling each of the pipe trenches T-PG with the sacrificial layer 112, and stacking the second conductive layer 111B, which is the capping layer, on the first conductive layer 111A and the sacrificial layer 112. The first conductive layer 111A may be a semiconductor substrate or a conductive layer formed on the semiconductor substrate. The second conductive layer 111B may be part of the semiconductor substrate or may be a conductive layer, such as a polysilicon layer.

A stack structure is formed by alternately stacking a plurality of first material layers 113A-113E and a plurality of second material layers 115A-115D over the substrate, including the pipe gate layer PG.

The first material layers 113A-113E are used to form interlayer insulating layers that will insulate and separate conductive layer patterns (to be formed later) from one another. The first material layers 113A-113E may be formed of oxide layers. The second material layers 115A-115D are used to form sacrificial layers, from which the conductive layer patterns will be formed. The second material layers 115A-115D may be made of materials (e.g., nitride layers) having a great etch selectivity for the first material layers 115A-115E. The number of second material layers 115A-115D may be determined by the number of memory cells to be stacked.

In some embodiments, the first material layers 113A-113E may be formed of conductive layers that are sacrificial layers, and the second material layers 115A-115D, which form the conductive layer patterns, may be formed of conductive layers that have a great etch selectivity for the sacrificial conductive layers. For example, the first material layers 113A-113E may be formed of undoped polysilicon, and the second material layers 115A-115D may be formed of doped polysilicon.

For the sake of example, it is hereinafter assumed that the first material layers 113A-113E are interlayer insulating layers and that the second material layers 115A-115D are formed of insulating layers.

Figure 2B:
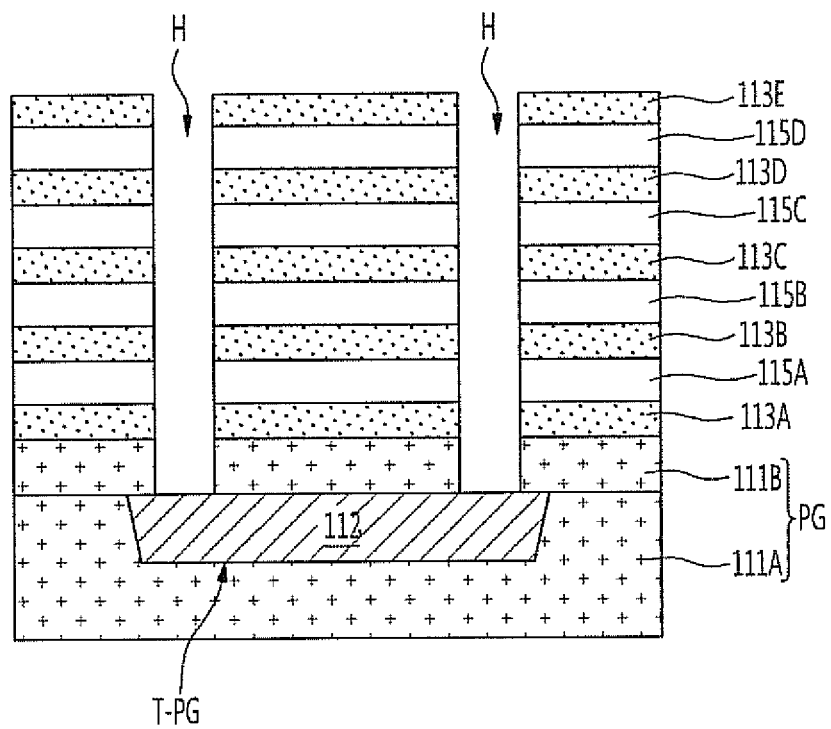

Referring to FIG. 2B, a plurality of holes H that expose the sacrificial layer 112 is formed by etching the first and the second material layers 113A-113E and 115A-115D. The holes H are formed to penetrate the first and the second material layers 113A-113E and 115A-115D. If the second conductive layer 111B is formed on the sacrificial layer 112, then the second conductive layer 111B will be further etched, in order to form the plurality of holes H. Thus, the plurality of holes H further penetrates the second conductive layer 111B. Here, a pair of the holes H is coupled to each of the pipe trenches T-PG in the pipe gate layers PG.

If the sacrificial layer 112 does not have a great etch selectivity for the first and the second material layers 113A-113E and 115A-115D, a passivation layer (not shown), having a great etch selectivity for the first and the second material layers 113A-113E and 115A-115D, may be formed on the sidewalls of the holes H, after forming the plurality of holes H. If the sacrificial layer 112 has a great etch selectivity for the first and the second material layers 113A-113E and 115A-115D, then the process of forming the passivation layer may be omitted.

Figure 2C:
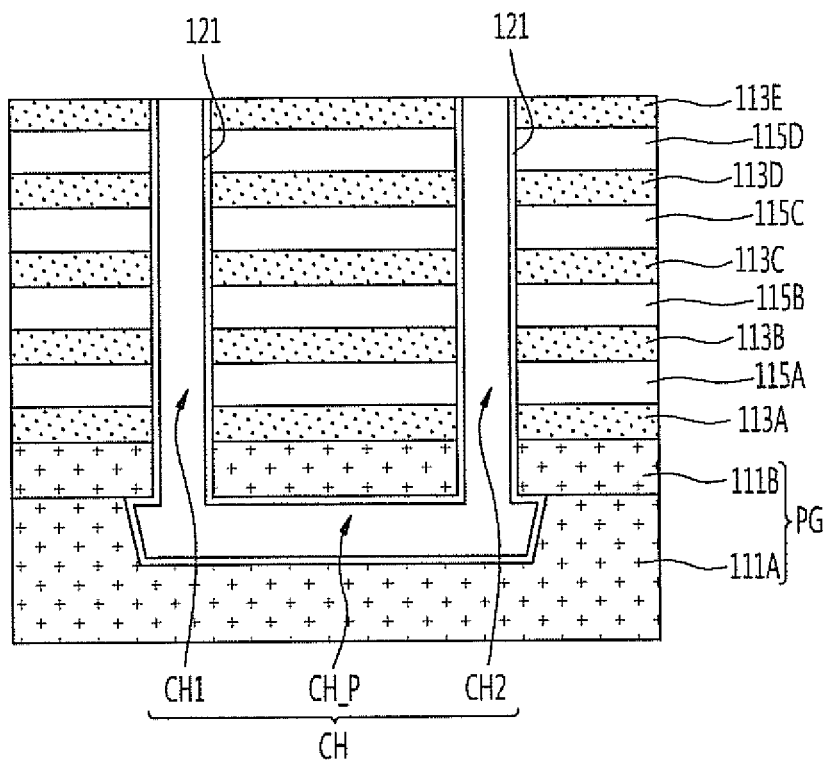

Referring to FIG. 2C, the sacrificial layer 112 exposed through the holes H is removed. If the passivation layer has been formed on the sidewalk of the holes H in the previous process, a process of removing the passivation layer may be further performed after removing the sacrificial layer 112.

The memory stack layer 121 is formed on a surface of the pipe trenches T-PG in the pipe gate layers PG and on a surface of the holes H. The memory stack layer 121 may include a charge blocking layer, a charge trap layer formed on the charge blocking layer, and a tunnel insulating layer formed on the charge trap layer. The charge trap layer may be formed of a nitride layer capable of trapping charges.

A semiconductor layer is formed over the memory stack layer 121, thereby forming a channel layer CH, which includes the vertical channel layers CH1 and CH2, disposed within the holes H, and the pipe channel layer CH_P, formed in the pipe trenches T-PG in the pipe gate layers PG. The vertical channel layers CH1 and CH2 include a first vertical channel layer CH1 coupled to one end of the pipe channel layer CH_P and a second vertical channel layer CH1 coupled to the other end of the pipe channel layer CH_P. The channel layer CH may completely fill the hole H and the pipe trenches T-PG in the pipe gate layers PG. Alternatively, the channel layer CH may have a hollow center, so as to have a tube shape. If the channel layer CH is formed in a tube shape, a process of filling the tube with an insulating layer (not shown) may be further performed.

The memory stack layer 121 and the channel layer CH may be formed on the first and the second material layers 113A-113E and 115A-115D outside of the holes H and the pipe trenches T-PG. In this case, after forming the memory stack layer 121 and the channel layer CH, the memory stack layer 121 and the channel layer CH outside of the holes H and the pipe trenches T-PG are polished to expose first and the second material layers 113A-113E and 115A-115D. As a result, the memory stack layer 121 and the channel layer CH remain only within the holes H and the pipe trenched T-PG.

Figure 2D:
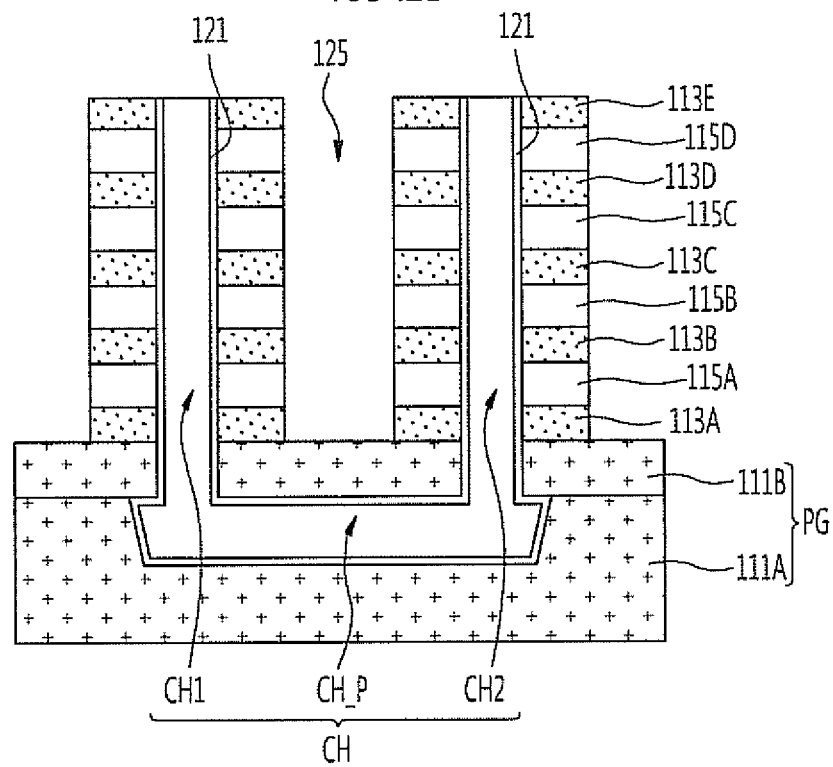

Referring to FIG. 2D, slits 125 are formed by etching the first and the second material layers 113A-113E and 115A-115D. The slits 125 are formed between the vertical channel layers CH1 and CH2. Thus, sidewalls of the first and the second material layers 113A-113E and 115A-115D are exposed through the slit 125, and the first and the second material layers 113A-113E and 115A-115D are split by the slit 125. Furthermore, a surface of the second conductive layer 111B is exposed.

Figure 2E:
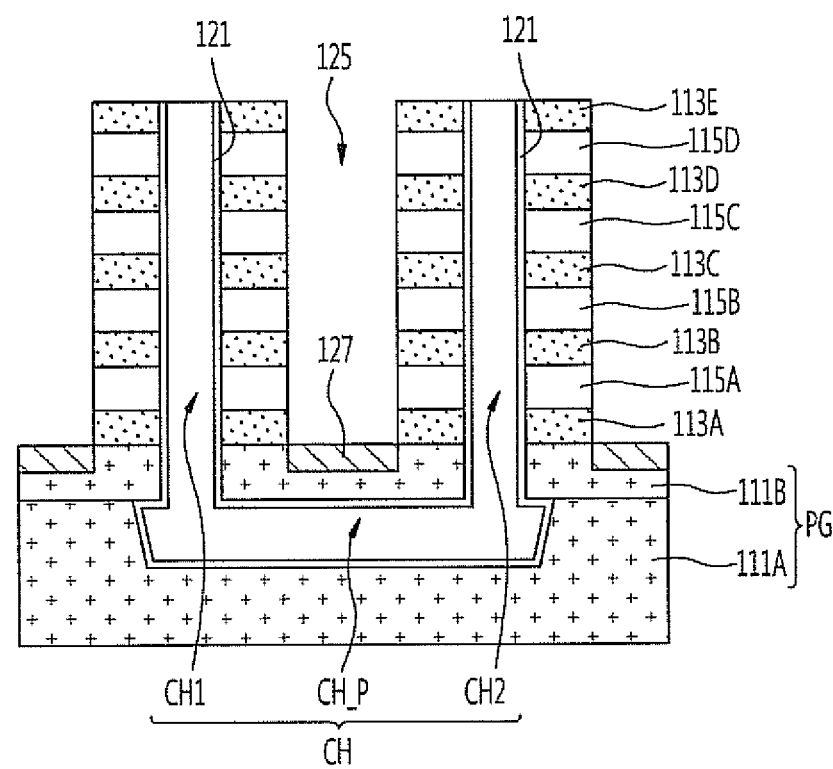

Referring to FIG. 2E, an etch-stop layer 127 is formed on the surface of the second conductive layer 111B exposed through the slit 125. The etch-stop layer 127 has a great etch selectivity for the second material layers 115A-115E and a third conductive layer, to be formed later.

In order to form the etch-stop layer 127, an oxide layer may be formed by oxidizing the exposed surface of the second conductive layer 111B using $O_2$ gas at a temperature of about 950° C. using, for example, a rapid thermal oxidation (RTO) method. In some embodiments, the oxide layer may be formed by oxidizing the exposed surface of the second conductive layer 111B using $H_2$, $O_2$, $N_2$, or Ar gas at a temperature of about 400° C. to about 600° C., using a plasma method.

Figure 2F:
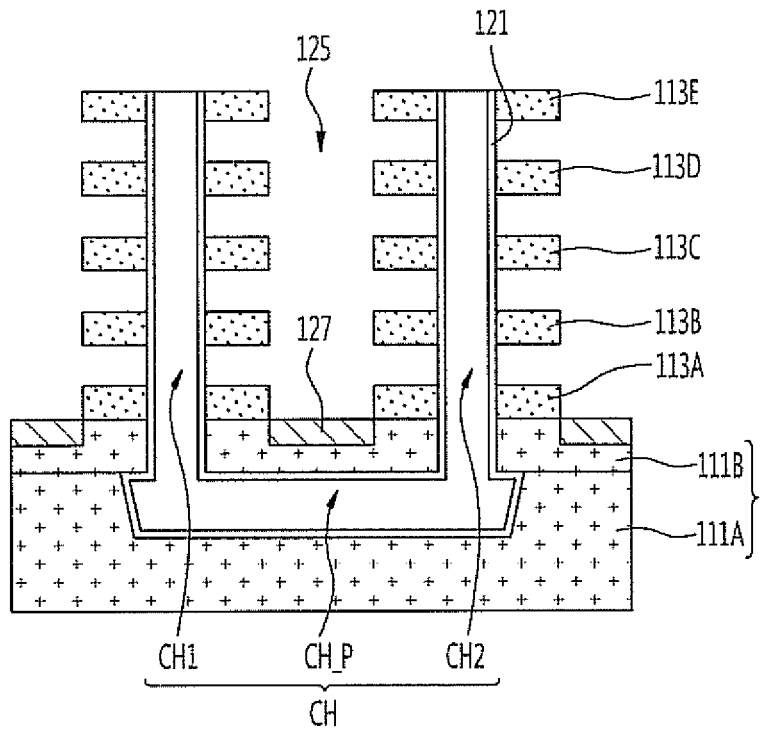

Referring to FIG. 2F, the second material layers 115A-115D are removed by an etch process. Thus, trenches T are formed between adjacent pairs of the first material layers 113A-113E. The second material layers 115A-115D are made of materials having a great etch selectivity for the etch-stop layer 127 and of the first material layers 113A-113E. Thus, only the second material layers 115A-115D are etched.

Figure 2G:
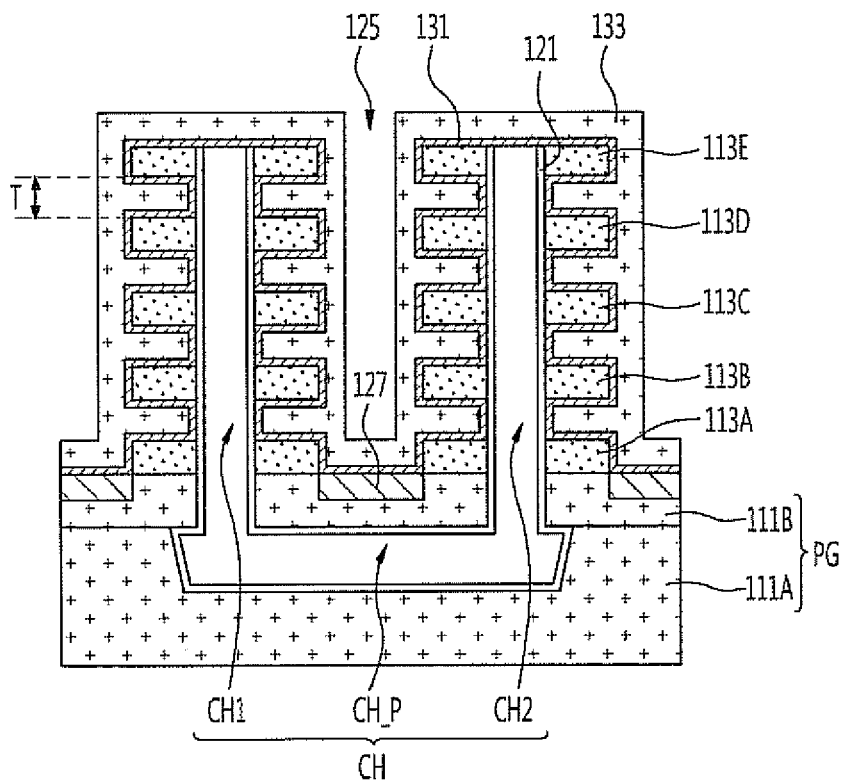

Referring to FIG. 2G, a third conductive layer 133 is formed over the entire structure so that the trenches T are filled with the third conductive layer 133. When the third conductive layer 133 is formed of a material including metal materials of low resistance, then a barrier metal layer 131 may be formed before forming the third conductive layer 133. The barrier metal layer 131 is formed along a surface of the entire structure, in which the trenches T are formed. The third conductive layer 133 is formed on the barrier metal layer 131 and fully fills the trenches T.

The barrier metal layer 131 may be formed by depositing TiN using, for example, an atomic layer deposition (ALD) method. Accordingly, the thickness of the barrier metal layer 131, formed on the etch-stop layer 127 at the bottom of the slit 125, is substantially the same as the thickness of the barrier metal layer 131 formed on a surface of the trenches T.

Figure 2H:
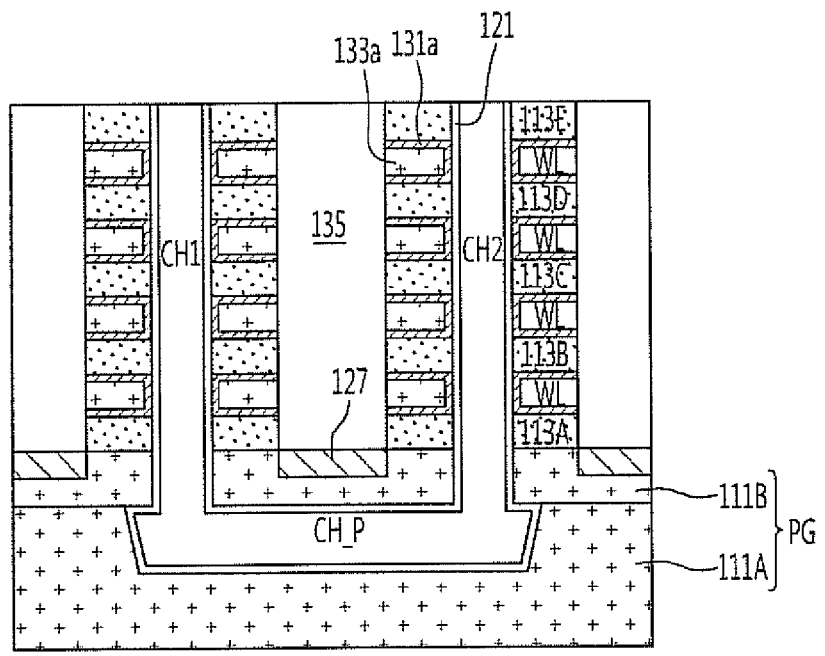

Referring to FIG. 2H, the barrier metal layer 131 and the third conductive layer 133, within the slit 125 and at the top surface of the upper most first material layer 113E, are etched so that the barrier metal layers 131 and conductive layer patterns 133a remain within the trenches T. Thus, the barrier metal layer patterns 131a and the conductive layer patterns 133a are split by the slit 125. The conductive layer patterns 133a may be used as word lines WL. Next, the slit 125 is filled within the insulating layer 135.

The process of etching the third conductive layer 133, is performed using an etchant to selectively etch the third conductive layer 133. Etching may be performed up to the barrier metal layer 131 at the bottom of the slit 125. In accordance with one embodiment of invention, the second conductive layer 111B is protected by the etch-stop layer 127, during the etch process of the third conductive layer 133, because the etch-stop layer 127 has a great etch selectivity for the third conductive layer 133. Accordingly, damage to the substrate, including the second conductive layer 111B, during the etch process of the third conductive layer 133 can be reduced or prevented.

In an alternative embodiment (not shown), if the first material layers 113A-113E are formed of sacrificial conductive layers and the second material layers 115A-115D are formed of third conductive layers, having a great etch selectivity for the sacrificial conductive layers, the following process, which is different than the process illustrated in FIGS. 2F to 2H, may be performed.

First, the first material layers 113A-113E are removed by an etch process, so that the trenches are formed between the second material layers 115A-115D of adjacent layers. The first material layers 113A-113E are made of materials having a great etch selectivity for the etch-stop layer 127 and the second material layers 115A-115D. Thus, only the first material layers 113A-113E may be selectively etched. Furthermore, during the etch process of the first material layers 113A-113E, which are formed of the sacrificial conductive layers, the substrate, including the second conductive layer 111B, is protected by the etch-stop layer 127.

Next, interlayer insulating layers are formed by filling the regions from which the first material layers 113A-113E have been removed with an insulating material. Here, the insulating layer 135 may also be formed within the slit 125.

Figure 3:
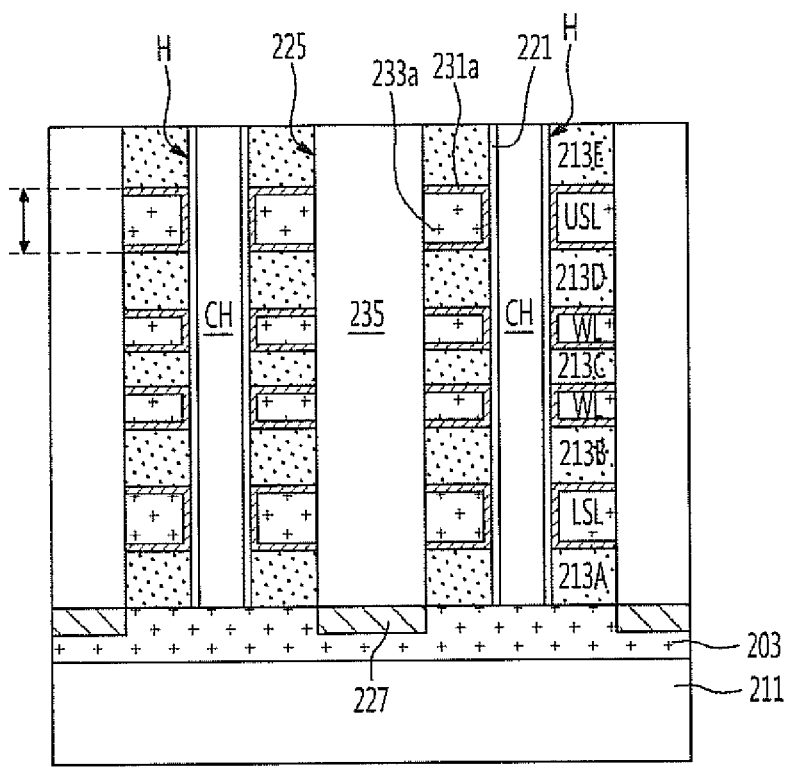
FIG. 3 shows a cross-sectional view of a 3-D nonvolatile memory device according to another embodiment of this disclosure.

FIG. 3 shows a cross-sectional view of a 3-D nonvolatile memory device according to another embodiment of this disclosure.

The 3-D nonvolatile memory device, according to another exemplary embodiment, includes a plurality of vertical channel layers CH, formed in holes H and upwardly protruding from a substrate 211, a plurality of interlayer insulating layers 213A-213E, a plurality of conductive layer patterns 233a, alternately stacked around the vertical channel layers CH, and a memory stack layer 221 configured to surround the outer walls of the channel layers CH.

An impurity is implanted in a specific depth from a surface of the substrate 211, thus forming a source region 203 that functions as a common source region or a common source line. An etch-stop layer 227 is formed on a surface of the source region 203 between the vertical channel layers CH adjacent to each other. The etch-stop layer 227 includes an oxide layer formed by oxidizing the surface of the source region 203 of the substrate 211 as described above with reference to FIG. 1.

A vertical channel layer CH may be formed by filling a hole H with a semiconductor material, so that the vertical channel layer CH completely fills the hole H. Alternatively, the vertical channel layer CH may have a hollow center, so as to have a tube shape. If the vertyical channel layer CH is formed in a tube shape, a process of filling the tube with an insulating layer (not shown) may be further performed. The memory stack layer 221, which surrounds the outer walls of the vertical channel layers CH, includes a tunnel insulating layer, a charge trap layer configured to surround the tunnel insulating layer, and a charge blocking layer configured to surround the charge trap layer.

The interlayer insulating layers 213A-213E and the conductive layer patterns 233a are separated by a slit 225. The slit 225 is formed between the adjacent vertical channel layers CH and is configured to penetrate the interlayer insulating layers 213A-213E and the conductive layer patterns 233a. The slit 225 is filled with an insulating layer 235. A lowermost layer of the conductive layer patterns 233a may become a first select line LSL, and an uppermost layer of the conductive layer patterns 233a may become a second select line USL. Furthermore, the conductive layer patterns between the first and the second select lines LSL and USL may become word lines WL.

The etch-stop layer 227 is formed on the surface of the source region 203 at the bottom of the slit 225. The etch-stop layer 227 may function as an etch-stop layer in a process of removing the unnecessary regions of the conductive layers so that the conductive layer patterns 233a remain within trenches T. That is, within regions in which the first select line LSL, the word lines WL, and the second select line USL will be formed.

If the conductive layer patterns 233a are made of metal materials having low resistance (for example, tungsten), in order to improve resistance of the first and the second select lines LSL and USL and the word lines WL, the first and the second select lines LSL and USL and the word lines WL may further include barrier metal layer patterns 231a that surrounds the conductive layer patterns 233a. The barrier metal layer patterns 231a may be made of TiN.

A first select transistor is formed at the intersection of the first select line LSL and the vertical channel layer CH, and a second select transistor is formed at the intersection of the second select line USL and the vertical channel layer CH. Furthermore, memory cell transistors are formed at the intersections of the word lines WL and the vertical channel layers CH. In accordance with the structure, the memory cell transistors according to an exemplary embodiment of this disclosure are stacked along the vertical channel layers CH, arranged in a 3-D way, and coupled in series between the first and the second select transistors, thus forming memory strings.

The 3-D nonvolatile memory device may be manufactured as follows.

First, the source region 203, which becomes the common source region or the common source line, is formed by implanting an impurity into the semiconductor substrate 211 or by forming a doped polysilicon layer, into which an impurity has been doped, on the semiconductor substrate 211. A plurality of first material layers and a plurality of second material layers are alternately stacked over the source region 203, as described above with reference to FIG. 2A.

A plurality of holes is formed by etching the first and the second material layers, as described above with reference to FIG. 2B. The memory stack layer 221 is formed on a surface of the holes, as described above with reference to FIG. 2C. Slits 125, through which a surface of the source region 203 is exposed, are formed by etching the first and the second material layers, as described above with reference to FIG. 2D. The etch-stop layer 227 is formed on the surface of the source region 203 exposed through the slit, as described above with reference to FIG. 2E. The process of forming the etch-stop layer 227 is the same as that described with reference to FIG. 2E.

Next, the trenches T are formed by removing the second material layers using an etch process, as described above with reference to FIG. 2F. The barrier metal layer and the conductive layer are formed within the trenches T, as described above with reference to FIGS. 2G and 2H. Next, the barrier metal layer patterns 231a and the conductive layer patterns 233a split by the gate lines LSL, WL, and USL are formed by etching the barrier metal layer and the conductive layer. Next, the slit is filled with the insulating layer 235.

Figure 4:
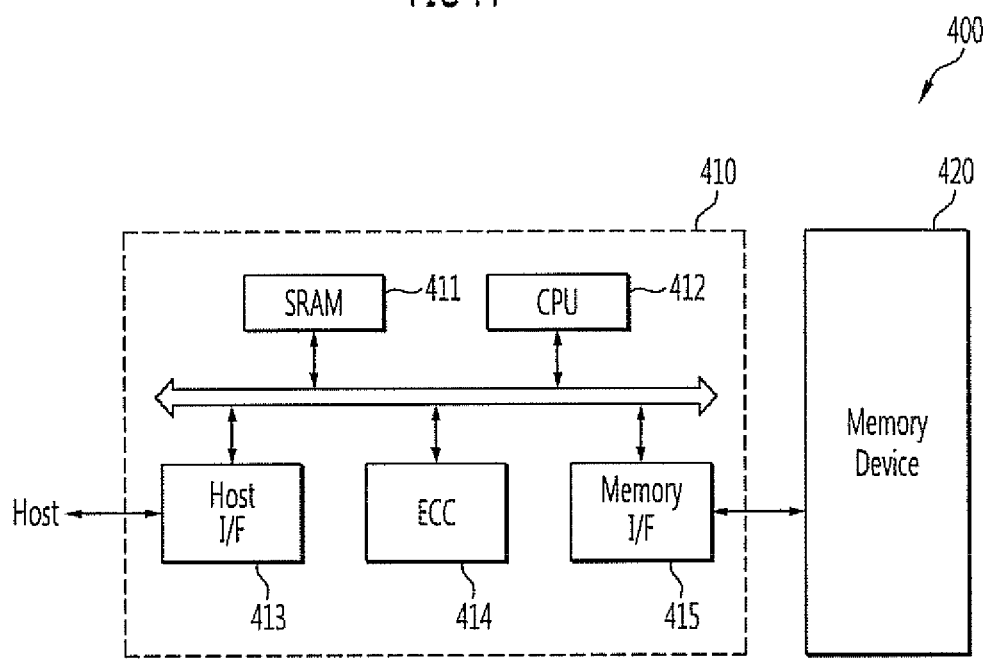
FIG. 4 is a schematic block diagram of a memory system according to an exemplary embodiment of this disclosure.

FIG. 4 is a schematic block diagram of a memory system according to an exemplary embodiment of this disclosure.

Referring to FIG. 4, the memory system 400 according to the exemplary embodiment of this disclosure includes a memory device 420 and a memory controller 410.

The memory device 420 includes at least one of the 3-D nonvolatile memory devices shown in FIGS. 1 and 3. That is, the memory device 420 includes the vertical channel layers upwardly protruded from the substrate, the interlayer insulating layers and the conductive layer patterns, alternately stacked around the vertical channel layers, the slit placed between the vertical channel layers, the slit configured to penetrate the interlayer insulating layers and the conductive layer patterns, and the etch-stop layer formed on the surface of the substrate at the bottom of the slit.

The memory controller 410 controls the exchange of data between a host and the memory device 420. The memory controller 410 may include a central processing unit (CPU) 412 for controlling the overall operation of the memory system 400. The memory controller 410 may include SRAM 411 used as the operating memory of the CPU 412. The memory controller 410 may further include a host interface (I/F) 413 and a memory I/F 415. The host I/F 413 may be equipped with a data exchange protocol between the memory system 400 and the host. The memory I/F 415 may couple the memory controller 410 and the memory device 420. The memory controller 410 may further include an error correction code (ECC) block 414. The ECC block 414 can detect errors in data read from the memory device 420 and correct the detected errors. Although not shown, the memory system 400 may further include a ROM device for storing code data for interfacing with the host. The memory system 400 may be used as a portable data storage card. In some embodiments, the memory system 400 may be embodied using a solid state disk (SSD) that may replace the hard disk of a computer system.

In accordance with this disclosure, the etch-stop layer is formed on a surface of the substrate between the vertical channel layers. Accordingly, after forming the slits, the substrate under the etch-stop layer can be protected from a process of etching the conductive layers, formed over the substrate, while etching the unnecessary parts of the conductive layers.

What is claimed is:

1. A three-dimensional (3-D) nonvolatile memory device, comprising:
    channel layers protruding perpendicular to a surface of a substrate;
    interlayer insulating layers and conductive layer patterns alternately formed to surround each of the channel layers;
    a slit formed between the channel layers, the slit penetrating the interlayer insulating layers and the conductive layer patterns;
    an oxidized portion of the substrate overlapping with the slit, wherein the oxidized portion is formed within the substrate at a bottom of the slit to serve as an etch stop layer; and
    an insulating layer filling the slit and being in contact with the oxidized portion of the substrate.

2. The 3-D nonvolatile memory device of claim 1, wherein the oxidized portion has a different etch selectivity from the conductive layer patterns.

3. The 3-D nonvolatile memory device of claim 1, further comprising:
    a pipe channel layer formed in the substrate and coupling a pair of the channel layers.

4. The 3-D nonvolatile memory device of claim 3, wherein the substrate comprises:

a capping layer formed over the pipe channel layer, the capping layer penetrated by the pair of channel layers.

5. The 3-D nonvolatile memory device of claim 1, further comprising:

barrier metal layer patterns surrounding each of the conductive layer patterns.

6. The 3-D nonvolatile memory device of claim 4, the oxidized portion is disposed within the capping layer.

7. A three-dimensional (3-D) nonvolatile memory device, comprising:

a pipe channel layer formed in the first conductive layer;

a second conductive layer formed over the pipe channel layer;

channel layers protruding perpendicular to the pipe channel layer and penetrating the second conductive layer;

interlayer insulating layers and conductive layer patterns alternately formed over the second conductive layer to surround each of the channel layers;

a slit formed between the channel layers, the slit penetrating the interlayer insulating layers and the conductive layer patterns; and an etch stop layer formed within a portion of the second conductive layer, wherein the portion of the second conductive layer overlaps with the slit.

* * * * *